(12) United States Patent
Agarwal et al.

(10) Patent No.: US 9,449,796 B2
(45) Date of Patent: Sep. 20, 2016

(54) PLASMA PROCESSING SYSTEM INCLUDING A SYMMETRICAL REMOTE PLASMA SOURCE FOR MINIMAL ION ENERGY

(71) Applicant: APPLIED MATERIALS, INC., Santa Clara, CA (US)

(72) Inventors: Ankur Agarwal, Fremont, CA (US); Ajit Balakrishna, Sunnyvale, CA (US); Rajinder Dhindsa, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 89 days.

(21) Appl. No.: 14/523,177

(22) Filed: Oct. 24, 2014

(65) Prior Publication Data

US 2016/0118223 A1    Apr. 28, 2016

(51) Int. Cl.
*H01L 21/00* (2006.01)
*H01J 37/32* (2006.01)
*H05H 1/46* (2006.01)

(52) U.S. Cl.
CPC ...... *H01J 37/3244* (2013.01); *H01J 37/32357* (2013.01); *H01J 37/32541* (2013.01); *H05H 1/46* (2013.01); *H05H 2001/466* (2013.01)

(58) Field of Classification Search
CPC .............................. H01J 37/32357
USPC ................ 118/723 ER; 156/345.35
See application file for complete search history.

(56) References Cited

U.S. PATENT DOCUMENTS

| | | | |
|---|---|---|---|
| 6,450,117 B1 * | 9/2002 | Murugesh | C23C 16/4402 118/723 ER |
| 8,765,232 B2 * | 7/2014 | Savas | C23C 16/45574 118/715 |
| 9,039,911 B2 | 5/2015 | Hudson et al. | |
| 9,147,581 B2 | 9/2015 | Guha | |
| 2006/0162661 A1 * | 7/2006 | Jung | C23C 16/345 118/723 ER |
| 2009/0044909 A1 * | 2/2009 | Hino | H01J 37/32623 156/345.43 |
| 2011/0006040 A1 * | 1/2011 | Savas | C23C 16/24 216/71 |
| 2014/0057447 A1 * | 2/2014 | Yang | H01L 21/3065 438/711 |
| 2015/0083582 A1 | 3/2015 | Dhindsa et al. | |
| 2015/0206775 A1 | 7/2015 | Hudson et al. | |
| 2015/0364339 A1 | 12/2015 | Guha | |
| 2015/0364349 A1 | 12/2015 | Guha | |

* cited by examiner

*Primary Examiner* — Sylvia R MacArthur
*Assistant Examiner* — Anna Crowell
(74) *Attorney, Agent, or Firm* — Robert M. Wallace

(57) ABSTRACT

A remote plasma source is enclosed by a pair of counter electrodes of conical or similar shape that are mirror images of one another and connected across a plasma power source.

20 Claims, 6 Drawing Sheets

PLASMA PROCESSING SYSTEM INCLUDING A SYMMETRICAL REMOTE PLASMA SOURCE FOR MINIMAL ION ENERGY

BACKGROUND

1. Technical Field

The disclosure concerns a remote plasma source for use in a plasma processing system.

2. Background Discussion

Etching applications increasingly require precise control of ions and radical species to treat (e.g., etch) the workpiece with high selectivity in a main process chamber. The workpiece may be a semiconductor wafer, for example. One method to achieve this is to use a remote plasma source with the main process chamber, which provides desired species to interact with the workpiece in the main chamber. A high density plasma is desired to achieve high etch rates on the workpiece. Therefore, high pressure operation is preferred, which increases gas density and plasma density. Inductively coupled plasma sources in the remote plasma source are not preferred due to the difficulty of igniting a plasma in this pressure range. A capacitively coupled plasma source (driven with an RF or DC voltage) is therefore preferred in the remote plasma source. A disadvantage of this approach is that the ions produced in a capacitively coupled remote plasma source have high energy and can bombard the remote plasma source surfaces, generating particle and/or metal contaminants which are drawn into the main chamber and land on the workpiece, impairing productivity. What is needed is a way of generating a high density plasma in the remote plasma source while minimizing ion sputtering of the remote plasma source hardware.

SUMMARY

A system for processing a workpiece, comprises a main reactor chamber comprising a chamber enclosure, a workpiece support surface in the main reactor chamber and a gas-receiving port in the chamber enclosure, and a remote plasma source. The remote plasma source comprises a pair of electrodes comprising respective first and second interior surfaces having an axis of symmetry and respective interior surfaces, the interior surfaces each having respective radii that vary as respective functions of axial location, the respective functions being opposites of one another, each of the interior surfaces comprising first and second circular edges of greater and lesser radii respectively, an insulating ring between the first edges of the interior surfaces, one of the second edges defining a gas inlet port and the other of the second edges defining an outlet port, the outlet port coupled to the gas-receiving port of the main reactor chamber. A process gas supply is coupled to the gas inlet port. A plasma source power supply has first and second terminals coupled to respective ones of the pair of electrodes.

In one embodiment, the interior surfaces are mirror images of one another. In one embodiment, the interior surfaces are of equal surface areas. In one embodiment, the interior surfaces are cone-shaped. In one embodiment, each of the interior surfaces provides a non-linear transition between the first and second circular edges and are of a non-conical shape.

In one embodiment, the system further comprises an inlet gas distribution shower head at the gas inlet port, and an outlet gas distribution shower head at the gas outlet port.

In one embodiment, the interior surfaces and the insulating ring form a process region enclosure of the remote plasma source.

In one embodiment, the main reactor chamber further comprises a vacuum pump. In one embodiment, the main reactor chamber further comprises a plasma power source and a plasma source power applicator coupled to the plasma power source. In one embodiment, the chamber enclosure of the main reactor chamber comprises a ceiling, the gas-receiving port being in the ceiling, and wherein the gas outlet port is mounted on the gas-receiving port.

In one embodiment, each of the pair of electrodes comprises an exterior surface of one of (A) a cylindrical shape or (B) a conical shape.

In accordance with a further aspect, a remote plasma source comprises a pair of electrodes comprising respective interior surfaces having an axis of symmetry and a radius that varies as a respective function of axial location, each of the interior surfaces comprising first and second circular edges of greater and lesser radii respectively, and an insulating ring between the first edges of the pair of electrodes. One of the second edges defining a gas inlet port and the other of the second edges defining an outlet port.

In one embodiment, a plasma source power supply has first and second terminals coupled to respective ones of the pair of electrodes.

In one embodiment, the interior surfaces are mirror images of one another. In one embodiment, the interior surfaces are of equal surface areas. In one embodiment, each of the respective functions corresponds to a straight line and the interior surfaces are cone-shaped. In one embodiment, each of the respective functions corresponds to a curve and the interior surfaces are of a non-conical shape.

In accordance with a yet further aspect, a plasma source comprises a pair of electrodes insulated from one another and comprising respective first and second interior surfaces having an axis of symmetry, the interior surfaces each having respective radii that vary as respective functions of axial location, the respective functions being opposite one another.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
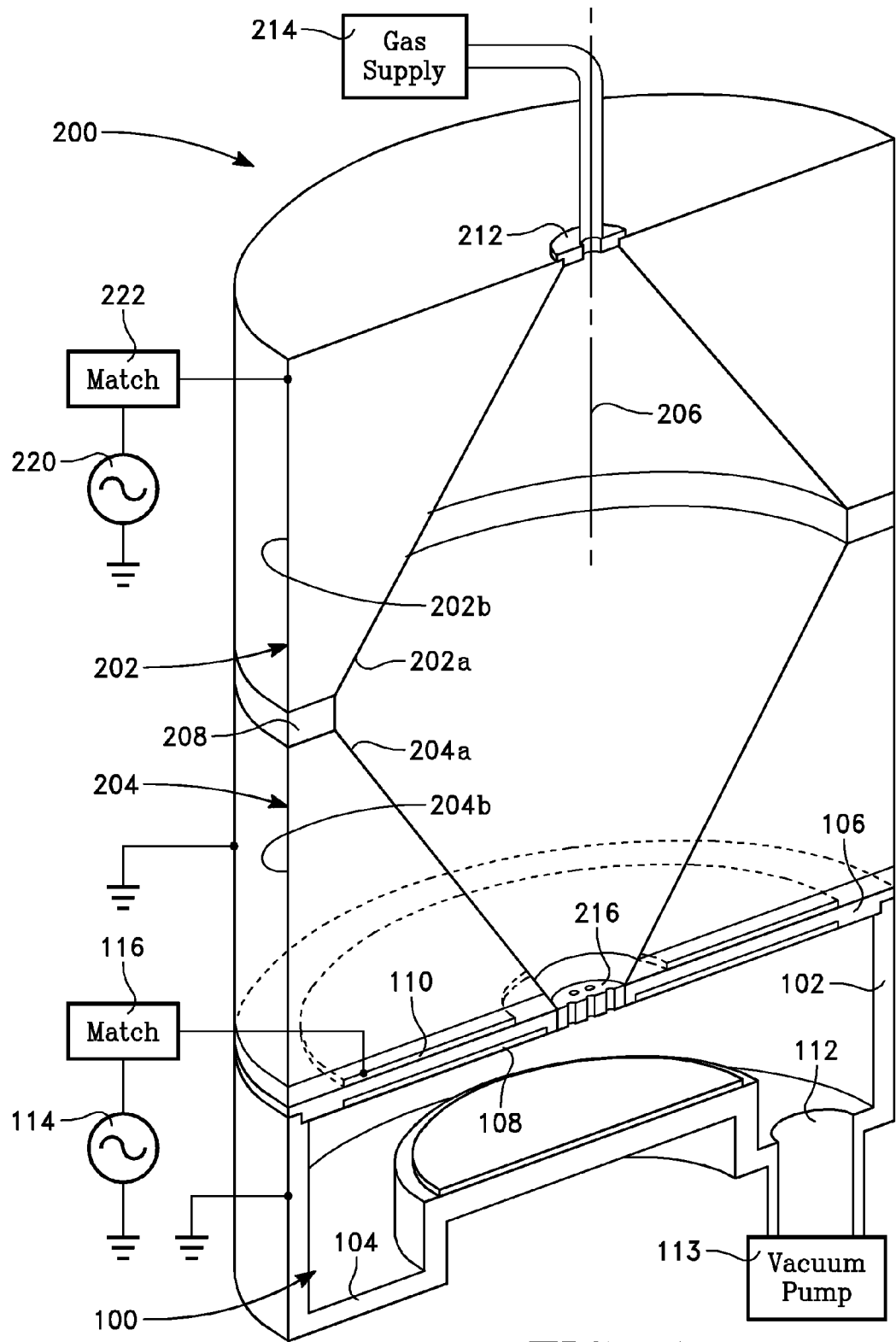
FIG. 1 is an orthographic projection of a portion of a plasma processing system in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

In embodiments, a high density plasma is generated while minimizing sputtering of the remote plasma source hardware by reducing the potential on the surfaces of the remote plasma source, thereby minimizing the energy of the ions incident on the surface and thus reducing sputtering. In order to minimize potential at the chamber surfaces, the remote plasma source includes a capacitively coupled plasma source of opposing electrodes of equal areas for the powered and grounded surfaces facing the plasma. In one embodiment, the opposing electrodes are mirror images of one another. In general, each of the opposing electrodes presents a sloped interior surface whose radius varies as a function of location along the axis of symmetry. The function may be any smooth curve or a straight line. In one embodiment, the function is a sloped straight line and the opposing electrodes are of opposing conical shapes. Constraining the opposing electrodes to be of equal areas minimizes the plasma potential with respect to grounded surfaces of the remote plasma source. This in turn minimizes ion energy at those surfaces, thereby reducing sputtering and introduction of metal contaminants. Under typical operating conditions, plasma potential with respect to ground is 80±20 V with symmetrical opposing electrodes over a wide pressure range of 1-20 Torr. In contrast, with a conventional or non-symmetrical design, the plasma potential is 120±20 V. The plasma potential is lower with the symmetrical opposing electrodes irrespective of the pressure. As a result, one further advantage of the symmetrical remote plasma source is an expanded process window (for example, pressure range) without loss of productivity.

By providing sloping internal surfaces of the opposing electrodes, plasma discharge conditions can meet the requirements of Paschen's curve for a continuum or range of discharge voltage, chamber pressure and gap distance. For example, as pressure increases, the plasma tends to move toward the opposing electrode that is RF-driven or away from the opposing electrode that is grounded. Thus, a wide range of process conditions can be accommodated.

Referring to FIG. 1, a reactor chamber 100 is enclosed by a side wall 102, a floor 104 and a ceiling 106. A gas distribution showerhead 108 at the ceiling 106 distributes process gas into the chamber 100. An RF source power applicator 110 may be provided on or near the ceiling 106, and may be an electrode, a coil antenna, a microwave radiator, a toroidal source power applicator or the like. An exhaust port 112 through the floor 104 is coupled to a vacuum pump 113. An RF plasma source power generator 114 is coupled through an impedance match 116 to the source power applicator 110.

Figure 2:
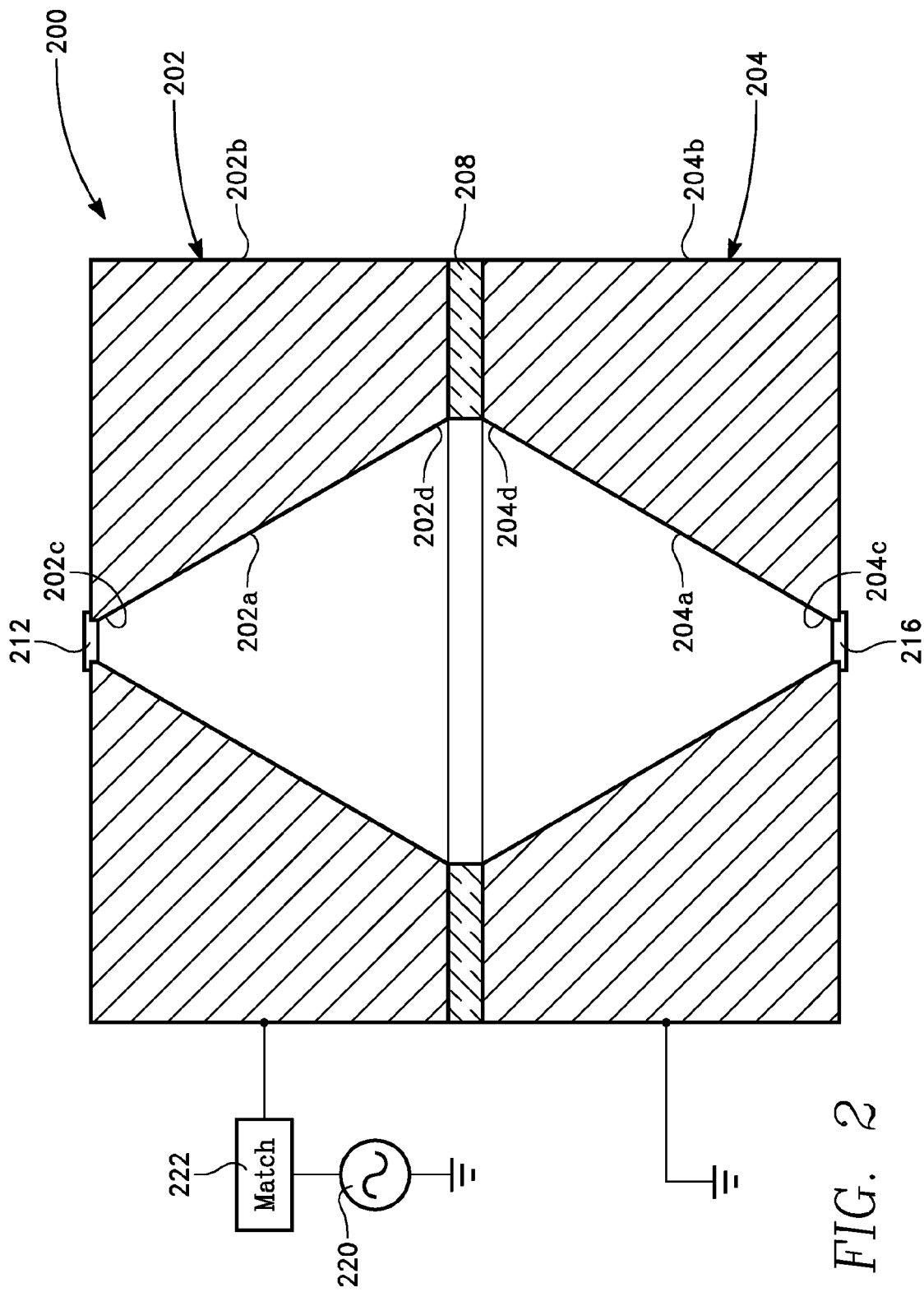
FIG. 2 is a cross-sectional view of a remote plasma source in the system of FIG. 1.

A remote plasma source 200 depicted in FIGS. 1 and 2 is coupled to provide plasma by-products to the reactor chamber 100. The remote plasma source 200 has a chamber enclosure including a pair of counter electrodes 202, 204 whose interior surfaces 202a, 204a are of equal (or nearly equal) areas. In the illustrated embodiment, the interior surfaces 202a, 204a of the counter electrodes 202, 204 are symmetrical about an axis of symmetry 206 and are mirror images of one another. The interior surfaces 202a, 204a enclose an interior volume of the remote plasma source 200. In the illustrated embodiment, the interior surfaces 202a, 204a are of opposing conical shapes. An annular insulator 208 separates the counter electrodes 202, 204 from one another. FIG. 2 is a cross-sectional view of the remote plasma source 200 of FIG. 1. In the embodiment of FIGS. 1 and 2, the counter electrodes 202, 204 have exterior surfaces 202b, 204b, respectively, that are cylindrical.

The conical shape of the interior surface 202a of the counter electrode 202 is truncated at circular edges 202c and 202d of respective greater and less radii. The circular edge 202c may be attached to a disk-shaped upper gas distribution shower head 212. A gas supply 214 is coupled to the upper gas distribution showerhead 212. The conical shape of the interior surface 204a of the counter electrode 204 is truncated at circular edges 204c and 204d of respective greater and less radii. The circular edge 204c may be attached to a disc-shaped lower gas distribution shower head 216. The lower gas distribution shower head 216 distributes gas flow from the remote plasma source 200 into the reactor chamber 100 through the ceiling 106. An RF power generator 220 is coupled through an RF impedance match 222 to one of the counter electrodes (e.g., the counter electrode 202) while the other counter electrode (e.g., the counter electrode 204) is grounded.

By providing the interior surfaces 202a, 204a of the counter electrodes 202, 204 as mirror images of one another, their surface areas are identical. As described above, shaping the opposing electrodes to be of equal areas minimizes the plasma potential with respect to grounded surfaces of the remote plasma source. This in turn minimizes ion energy at those surfaces, thereby reducing sputtering and introduction of metal contaminants, a significant advantage. In the illustrated embodiments, the interior surfaces 202a, 204a of the counter electrodes 202, 204 are conically shaped. In other embodiments, their shape may be modified to be a mixture of conical and spherical shapes, while being mirror images of one another.

Figure 2A:
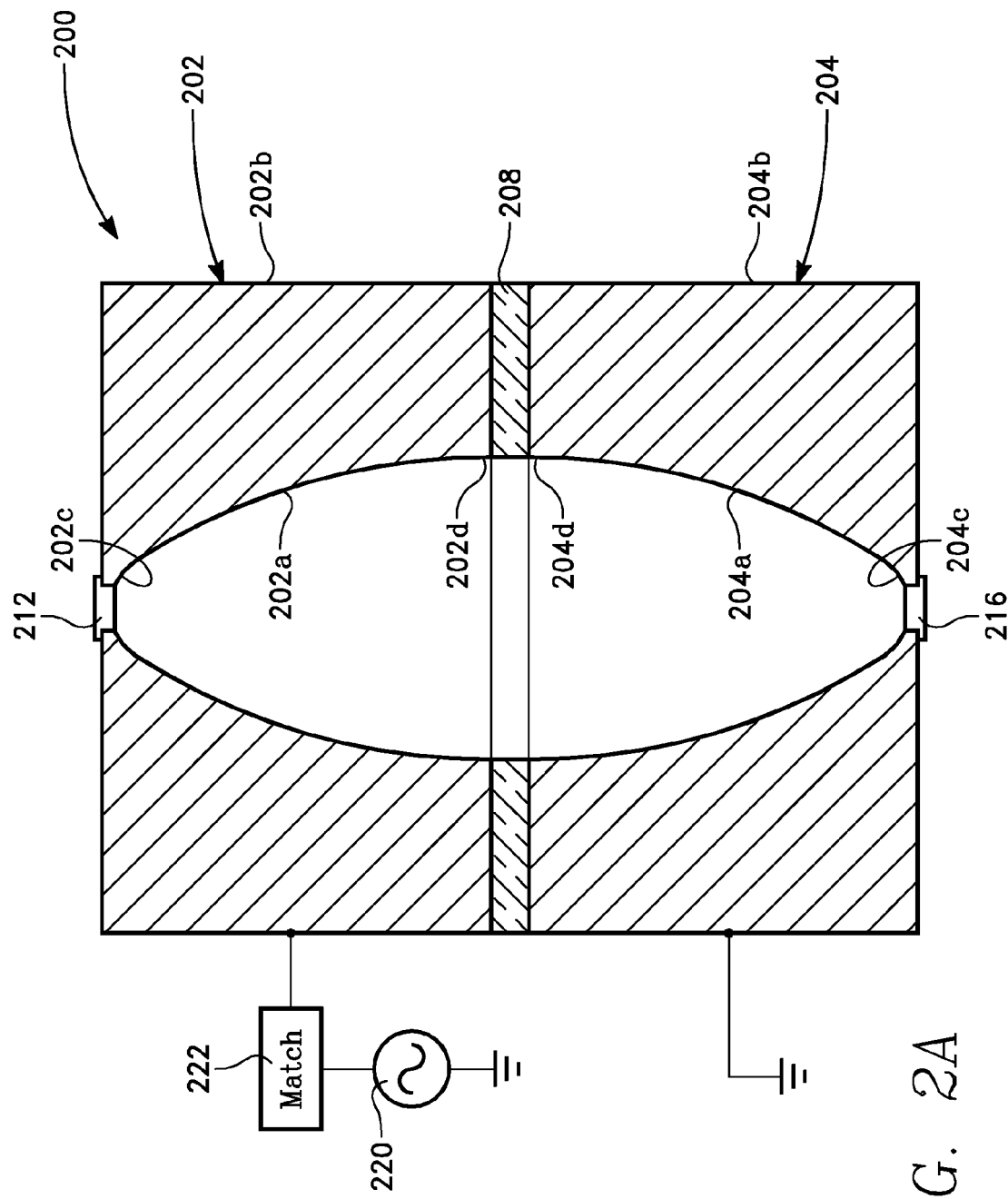
FIG. 2A is a cross-sectional view of a remote plasma source in accordance with one embodiment.

In general, each of the interior surfaces 202a, 204a has a radius that varies as a function of location along the axis of symmetry. If the function corresponds to a sloped straight line, then each interior surface 202a, 204a is conically shaped, as depicted in FIG. 2. If the function is non-linear, then each interior surface 202a, 204a is of a non-conical shaped, such as, for example, a parabolic shape as depicted in FIG. 2A.

Figure 3:
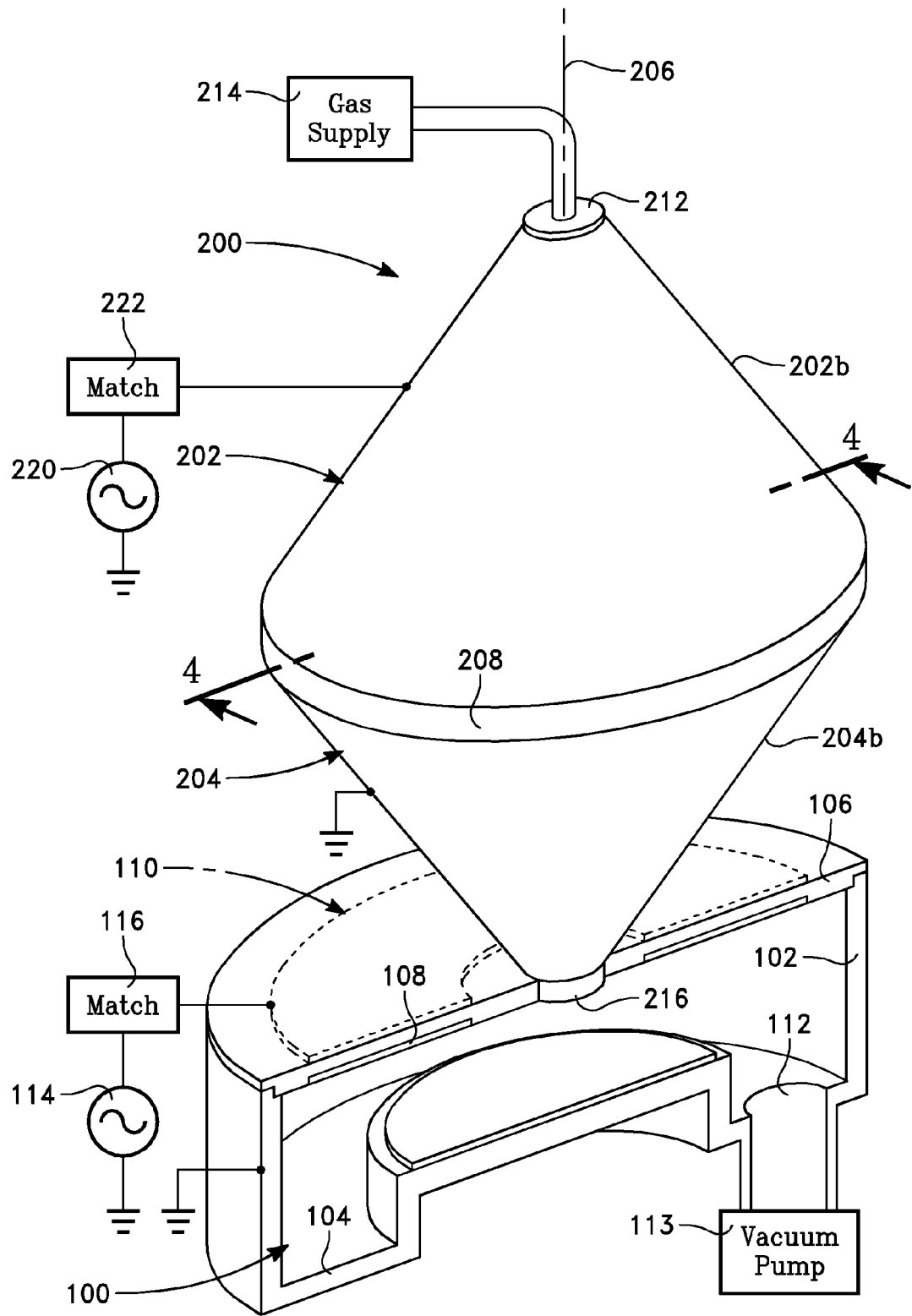
FIG. 3 is an orthographic projection of a portion of a plasma processing system in accordance with a second embodiment.
Figure 4:
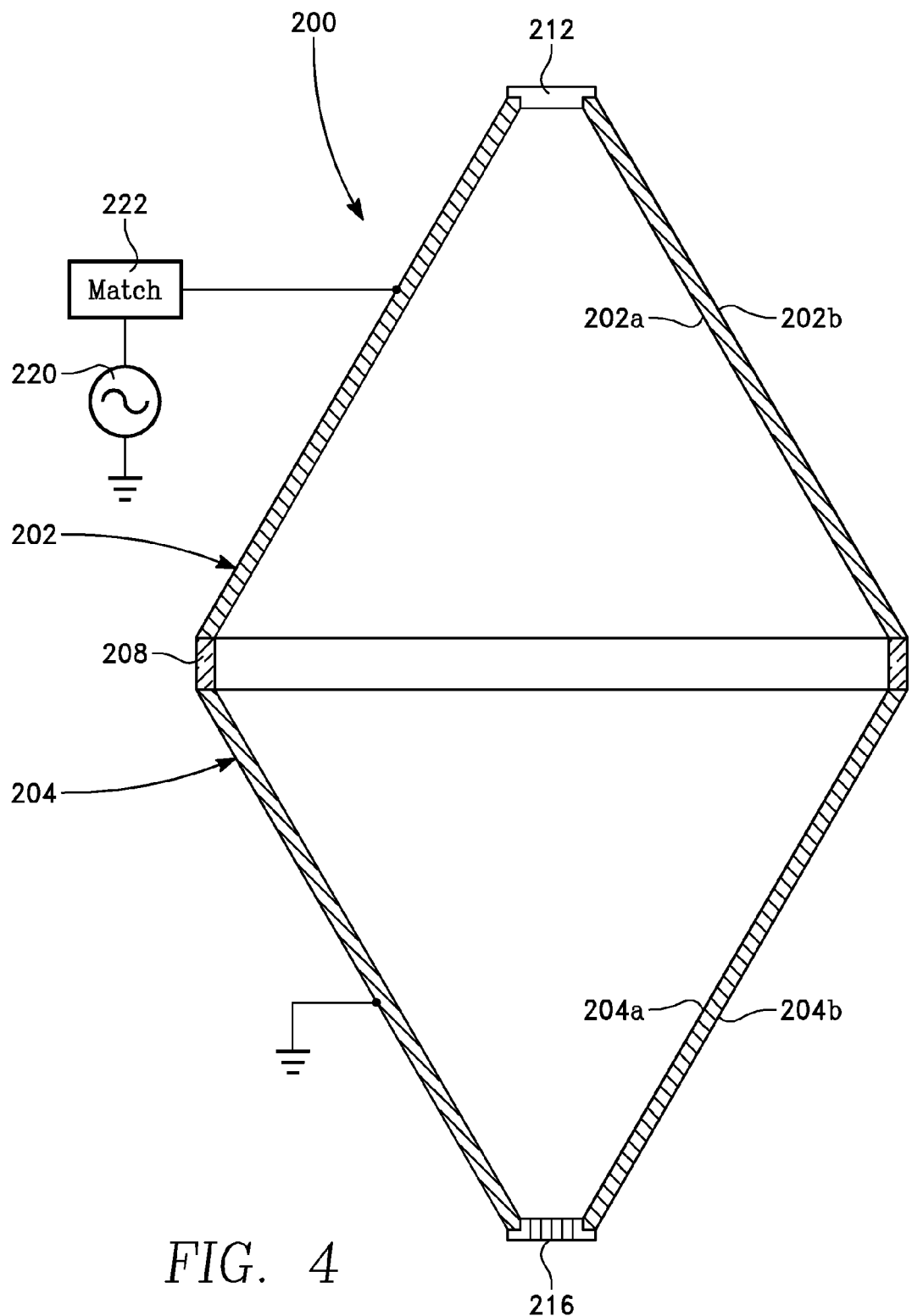
FIG. 4 is a cross-sectional view taken along lines 4-4 of FIG. 3.

FIGS. 3 and 4 depict an embodiment in which the exterior surfaces 202b, 204b of the counter electrodes 202, 204 are of a shape other than cylindrical. In the illustrated embodiment of FIGS. 3 and 4, the exterior surfaces 202b, 204b are conically shaped.

Figure 5:
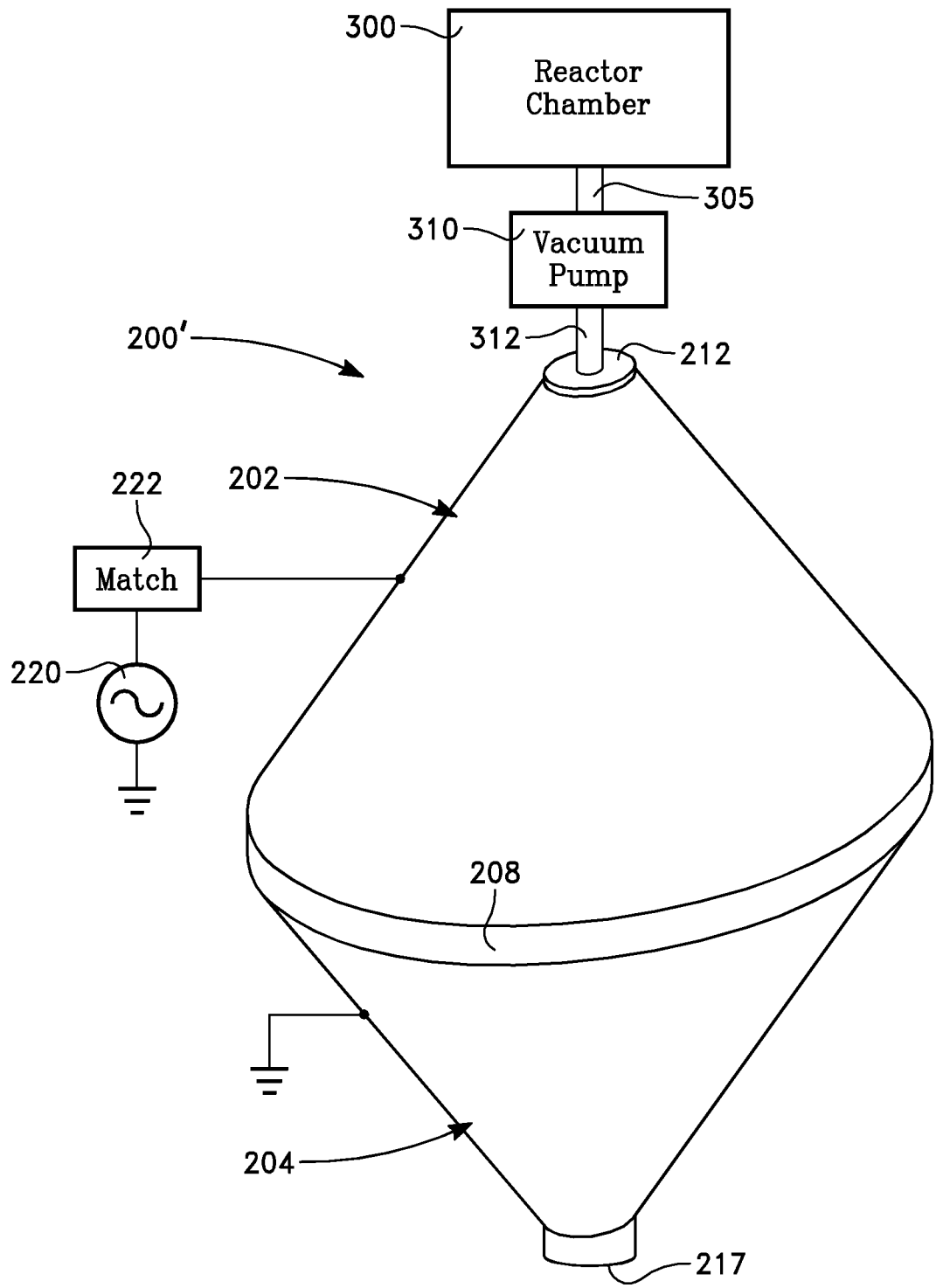
FIG. 5 depicts an abatement system in accordance with a further embodiment.

FIG. 5 depicts an embodiment in which the remote plasma source 200 of any of FIGS. 1-4 is employed as an abatement chamber 200' for external abatement of waste gases from a conventional process reactor 300. The conventional process reactor 300 has an exhaust port 305 coupled to a vacuum pump 310 having an output port 312. The output port 312 of the vacuum pump 310 is connected to the upper gas distribution showerhead 212 at the upper end of the abatement chamber 200'. The lower gas distribution showerhead 216 depicted in the embodiments of FIGS. 1-4 may be eliminated in the embodiment of FIG. 5, leaving a bottom opening 217 in its place. The bottom opening 217 may function as an atmospheric exhaust port. An advantage of such an abatement system is that metal contamination in the gases exhausted from the abatement chamber 200' is minimized. Such minimization of metal contamination is discussed above with reference to the embodiments of FIGS. 1-4.

While the foregoing is directed to embodiments of the present invention, other and further embodiments of the invention may be devised without departing from the basic scope thereof, and the scope thereof is determined by the claims that follow.

What is claimed is:

1. A system for processing a workpiece, comprising:
   a main reactor chamber comprising a chamber enclosure, a workpiece support surface in said main reactor chamber and a gas-receiving port in said chamber enclosure;
   a remote plasma source comprising:
      a pair of electrodes comprising respective first and second interior surfaces having an axis of symmetry and respective interior surfaces, said interior surfaces each having respective radii that vary as respective functions of axial location, said respective functions being opposites of one another;
      each of said interior surfaces comprising first and second circular edges of greater and lesser radii respectively;
      an insulating ring between the first edges of said interior surfaces;
      one of said second edges defining a gas inlet port and the other of said second edges defining an outlet port, said outlet port coupled to said gas-receiving port of said main reactor chamber;
      a process gas supply coupled to said gas inlet port; and
      a plasma source power supply having first and second terminals coupled to respective ones of said pair of electrodes.

2. The system of claim 1 wherein said interior surfaces are mirror images of one another.

3. The system of claim 1 wherein said interior surfaces are of equal surface areas.

4. The system of claim 1 wherein said interior surfaces are cone-shaped.

5. The system of claim 1 wherein each of said interior surfaces provide a non-linear transition between said first and second circular edges and are of a non-conical shape.

6. The system of claim 1 further comprising:
   an inlet gas distribution shower head at said gas inlet port; and
   an outlet gas distribution shower head at said gas outlet port.

7. The system of claim 1 wherein said interior surfaces and said insulating ring form a process region enclosure of said remote plasma source.

8. The system of claim 1 wherein said main reactor chamber further comprises a vacuum pump.

9. The system of claim 7 wherein said main reactor chamber further comprises a plasma power source and a plasma source power applicator coupled to said plasma power source.

10. The system of claim 1 wherein said chamber enclosure of said main reactor chamber comprises a ceiling, said gas-receiving port being in said ceiling, and wherein said gas outlet port is mounted on said gas-receiving port.

11. The system of claim 1 wherein each of said pair of electrodes comprises an exterior surface of one of (A) a cylindrical shape or (B) a conical shape.

12. A plasma chamber comprising:
   a pair of electrodes comprising respective opposing interior surfaces having an axis of symmetry, each of said interior surfaces having a radius that varies as a function of axial location;
   each of said interior surfaces comprising first and second circular edges of greater and lesser radii respectively;
   an insulating ring between the first edges of said pair of electrodes; and
   one of said second edges defining a gas inlet port and the other of said second edges defining an outlet port.

13. The plasma chamber of claim 12 further comprising a plasma source power supply having first and second terminals coupled to respective ones of said pair of electrodes.

14. The plasma chamber of claim 12 wherein said interior surfaces are mirror images of one another.

15. The plasma chamber of claim 12 wherein said interior surfaces are of equal surface areas.

16. The plasma chamber of claim 12 wherein each said function corresponds to a straight line and said interior surfaces are cone-shaped.

17. The plasma chamber of claim 12 wherein each said function corresponds to a curve and said interior surfaces are of a non-conical shape.

18. The plasma chamber of claim 12 wherein said gas inlet port is connectable to receive exhaust gas originating from a plasma reactor, whereby said gas outlet port functions as an exhaust port and said plasma chamber functions as an abatement chamber.

19. The plasma chamber of claim 12 wherein said each of said pair of electrodes comprises an exterior surface of one of (A) cylindrical shape, (B) a conical shape.

20. A plasma source comprising:
   a pair of electrodes insulated from one another and comprising respective first and second interior surfaces having an axis of symmetry, said interior surfaces each having respective radii that vary as respective functions of axial location, said respective functions being opposite one another.

* * * * *